(12) United States Patent
Hwang et al.

(10) Patent No.: US 12,015,018 B2
(45) Date of Patent: Jun. 18, 2024

(54) SEMICONDUCTOR PACKAGE WITH MULTIPLE REDISTRIBUTION SUBSTRATES

(71) Applicant: SAMSUNG ELECTRONICS CO., LTD., Suwon-si (KR)

(72) Inventors: Hyeonjeong Hwang, Cheonan-si (KR); Kyoung Lim Suk, Suwon-si (KR); Seokhyun Lee, Hwaseong-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/060,853

(22) Filed: Dec. 1, 2022

(65) Prior Publication Data

US 2023/0085930 A1      Mar. 23, 2023

Related U.S. Application Data

(63) Continuation of application No. 17/184,978, filed on Feb. 25, 2021, now Pat. No. 11,538,798.

(30) Foreign Application Priority Data

Aug. 3, 2020   (KR) ........................ 10-2020-0096713

(51) Int. Cl.
*H01L 25/10*      (2006.01)
*H01L 21/48*      (2006.01)
(Continued)

(52) U.S. Cl.
CPC ........ *H01L 25/105* (2013.01); *H01L 21/4853* (2013.01); *H01L 21/4857* (2013.01); (Continued)

(58) Field of Classification Search
CPC ... H01L 25/105; H01L 25/03; H01L 23/3128; H01L 23/5383; H01L 23/5386; (Continued)

(56) References Cited

U.S. PATENT DOCUMENTS 9,324,696 B2    4/2016  Choi et al.
10,157,849 B2   12/2018 Huang et al.
(Continued)

FOREIGN PATENT DOCUMENTS

KR    10-1985124 B1    5/2019
TW    201838127 A      10/2018
(Continued)

*Primary Examiner* — Kyoung Lee
*Assistant Examiner* — Christina A Sylvia
(74) *Attorney, Agent, or Firm* — Sughrue Mion, PLLC

(57) ABSTRACT

A semiconductor package includes a first redistribution substrate, a first semiconductor chip mounted on the first redistribution substrate, a first molding layer on the first redistribution substrate and covering a top surface and lateral surfaces of the first semiconductor chip, a second redistribution substrate on the first molding layer, and an adhesive film between the second redistribution substrate and the first molding layer. The adhesive film is spaced apart from the first semiconductor chip and covers a top surface of the first molding layer. A lateral surface of the adhesive film is coplanar with a lateral surface of the second redistribution substrate.

9 Claims, 13 Drawing Sheets

(51) Int. Cl.
  *H01L 21/56* (2006.01)
  *H01L 21/683* (2006.01)
  *H01L 21/78* (2006.01)
  *H01L 23/31* (2006.01)
  *H01L 23/538* (2006.01)
  *H01L 25/00* (2006.01)

(52) U.S. Cl.
  CPC .......... *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 25/50* (2013.01); *H01L 2221/68372* (2013.01); *H01L 2225/1035* (2013.01); *H01L 2225/1058* (2013.01)

(58) Field of Classification Search
  CPC ......... H01L 23/5389; H01L 2225/1035; H01L 2225/1058; H01L 2221/68331; H01L 2221/68345; H01L 2221/68359; H01L 2224/08225
  See application file for complete search history.

(56) References Cited

U.S. PATENT DOCUMENTS

| | | | |
|---|---|---|---|
| 10,163,825 B1 * | 12/2018 | Liao | H01L 23/49811 |
| 10,283,474 B2 | 5/2019 | Jeng et al. | |
| 10,347,585 B2 | 7/2019 | Shin et al. | |
| 10,446,523 B2 | 10/2019 | Marimuthu et al. | |
| 10,784,220 B2 | 9/2020 | Jeng et al. | |
| 10,916,488 B2 | 2/2021 | Lin et al. | |
| 2010/0237481 A1 | 9/2010 | Chi et al. | |
| 2013/0082399 A1 * | 4/2013 | Kim | H01L 24/97 257/E23.145 |
| 2015/0115467 A1 | 4/2015 | Park et al. | |
| 2015/0187742 A1 | 7/2015 | Kwon et al. | |
| 2015/0221601 A1 | 8/2015 | Kim et al. | |
| 2015/0255447 A1 * | 9/2015 | Hung | H01L 25/0657 257/774 |
| 2015/0294939 A1 | 10/2015 | Yu et al. | |
| 2016/0104659 A1 * | 4/2016 | Park | H01L 23/49838 257/774 |
| 2016/0148909 A1 * | 5/2016 | Chung | H01L 21/76898 257/778 |
| 2016/0260695 A1 | 9/2016 | Chung et al. | |
| 2016/0334845 A1 | 11/2016 | Mittal et al. | |
| 2016/0343685 A1 | 11/2016 | Lin et al. | |
| 2017/0154878 A1 | 6/2017 | Kim et al. | |
| 2017/0278830 A1 | 9/2017 | Kim | |
| 2018/0061765 A1 | 3/2018 | Gozu et al. | |
| 2018/0145061 A1 | 5/2018 | Jeong et al. | |
| 2018/0269188 A1 | 9/2018 | Yu et al. | |
| 2018/0277489 A1 | 9/2018 | Han et al. | |
| 2018/0315674 A1 * | 11/2018 | Chen | H01L 23/481 |
| 2019/0006339 A1 | 1/2019 | Lau et al. | |
| 2019/0229078 A1 | 7/2019 | Kim et al. | |
| 2019/0333837 A1 | 10/2019 | Kang et al. | |
| 2019/0380211 A1 | 12/2019 | Lin et al. | |
| 2020/0006234 A1 | 1/2020 | Jeng et al. | |
| 2020/0043908 A1 | 2/2020 | Chung et al. | |
| 2020/0105544 A1 | 4/2020 | Tsai et al. | |

FOREIGN PATENT DOCUMENTS

| | | |
|---|---|---|
| TW | 201906103 A | 2/2019 |
| TW | 201917849 A | 5/2019 |
| TW | 201946238 A | 12/2019 |
| TW | 202015197 A | 4/2020 |
| WO | 2006/035258 A1 | 4/2006 |

* cited by examiner

SEMICONDUCTOR PACKAGE WITH MULTIPLE REDISTRIBUTION SUBSTRATES

CROSS-REFERENCE TO RELATED APPLICATION

This application is a Continuation of U.S. application Ser. No. 17/184,978, filed Feb. 25, 2021, which is based on and claims priority under 35 U.S.C § 119 to Korean Patent Application No. 10-2020-0096713 filed on Aug. 3, 2020 in the Korean Intellectual Property Office, the disclosures of which are incorporated by reference herein in their entireties.

BACKGROUND

The disclosure relates to a semiconductor package, and more particularly, to a semiconductor package including a redistribution substrate.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of the electronics industry, various research has been conducted to improve reliability and durability of semiconductor packages.

SUMMARY

Example embodiments of the disclosure provide a semiconductor package with enhanced reliability.

In accordance with an aspect of the disclosure, a semiconductor package includes a first redistribution substrate; a first semiconductor chip mounted on the first redistribution substrate; a first molding layer on the first redistribution substrate, the first molding layer covering a top surface and lateral surfaces of the first semiconductor chip, the top surface facing away from the first redistribution substrate; a second redistribution substrate on the first molding layer; and an adhesive film between the second redistribution substrate and the first molding layer, wherein the adhesive film is spaced apart from the first semiconductor chip and covers a top surface of the first molding layer, and wherein a lateral surface of the adhesive film is coplanar with a lateral surface of the second redistribution substrate.

In accordance with an aspect of the disclosure, a semiconductor package includes a first redistribution substrate; a first semiconductor chip mounted on the first redistribution substrate; a first molding layer on the first redistribution substrate, the first molding layer covering a top surface and lateral surfaces of the first semiconductor chip, the top surface facing away from the first redistribution substrate; a second redistribution substrate on the first molding layer; a second semiconductor chip mounted on the second redistribution substrate; and an adhesive film between the second redistribution substrate and the first molding layer, wherein the second redistribution substrate includes an upper dielectric layer; a connection pad exposed by the upper dielectric layer; and a connection terminal on a bottom surface of the connection pad, wherein the adhesive film extends in a first direction parallel to the top surface of the first semiconductor chip, the adhesive film being in contact with a top surface of the first molding layer and with a bottom surface of the upper dielectric layer of the second redistribution substrate, and wherein a width in the first direction of the adhesive film is equal to a width in the first direction of the first redistribution substrate.

In accordance with an aspect of the disclosure, a semiconductor package includes a first redistribution substrate; a first semiconductor chip mounted on the first redistribution substrate; a first molding layer on the first redistribution substrate, the first molding layer covering a top surface and lateral surfaces of the first semiconductor chip, the top surface of the first semiconductor chip facing away from the first redistribution substrate; a second redistribution substrate on the first molding layer; a second semiconductor chip mounted on the second redistribution substrate; a second molding layer on the second redistribution substrate, the second molding layer covering a top surface and lateral surfaces of the second semiconductor chip; an adhesive film between the second redistribution substrate and the first molding layer; a conductive structure that penetrates the first molding layer and connects the first redistribution substrate to the second redistribution substrate; and an external terminal on a bottom surface of the first redistribution substrate, wherein the first redistribution substrate includes an under-bump pattern in contact with the external terminal; a first connection pad in contact with the conductive structure; a plurality of first redistribution patterns that connect the first connection pad to the under-bump pattern; and a lower dielectric layer that surrounds the plurality of first redistribution patterns, wherein a lateral surface of the adhesive film is coplanar with a lateral surface of the first molding layer.

DETAILED DESCRIPTION OF EMBODIMENTS

Figure 1A:
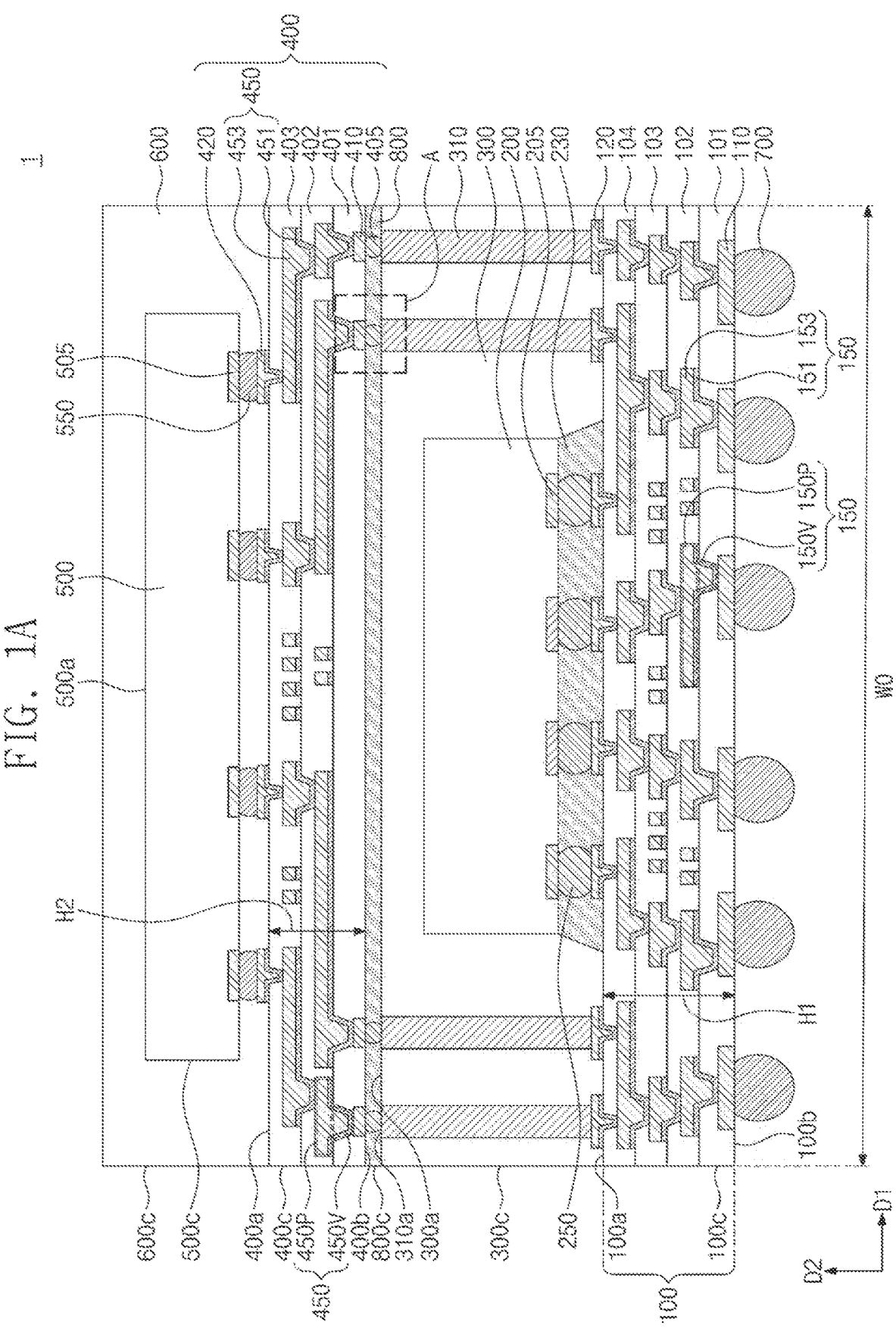
FIG. 1A illustrates a cross-sectional view showing a semiconductor package according to an embodiment.

In this description, like reference numerals may indicate like components. The following will now describe a semiconductor package and its fabrication method according to the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1B:
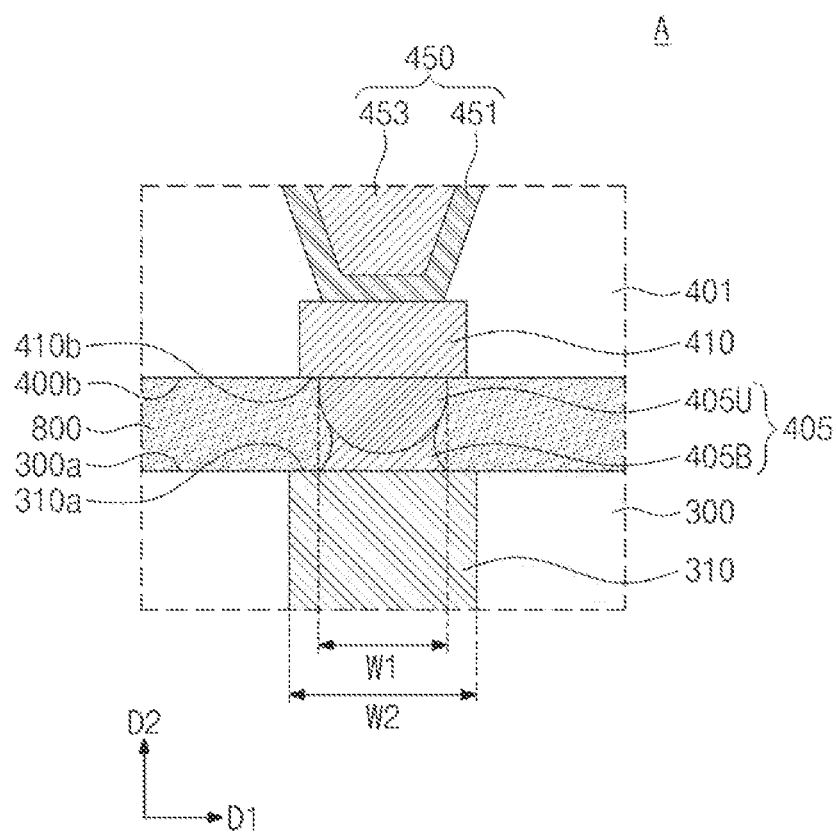
FIGS. 1B and 1C illustrate enlarged views showing section A of FIG. 1A.
Figure 1C:
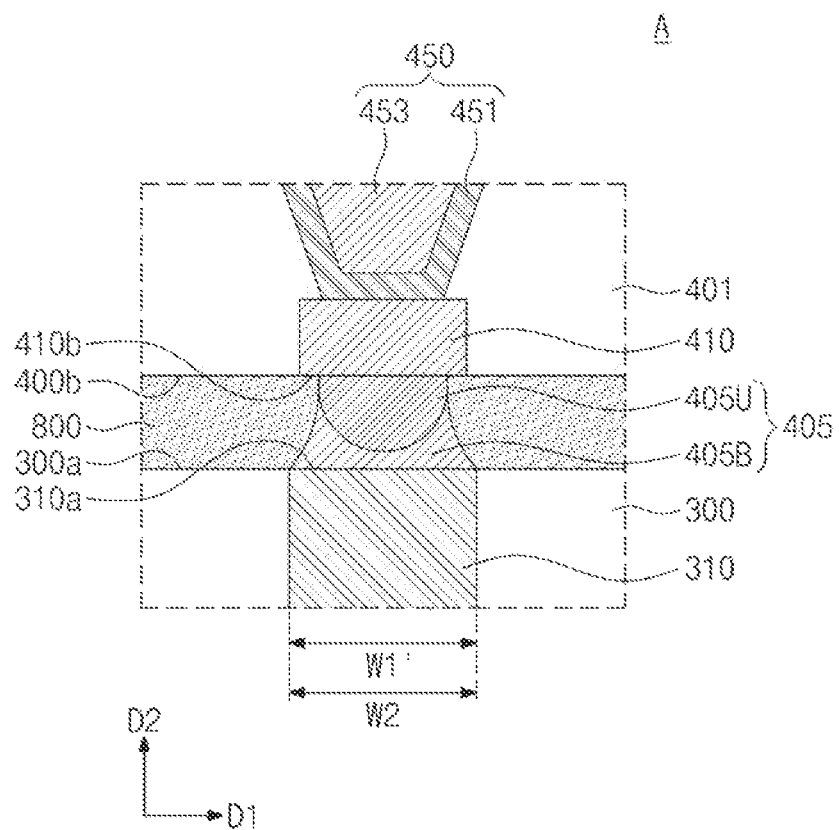

FIG. 1A illustrates a cross-sectional view showing a semiconductor package according to some example embodiments. FIGS. 1B and 1C illustrate enlarged views showing section A of FIG. 1A.

Referring to FIG. 1A, a semiconductor package 1 according to some example embodiments may include a first redistribution substrate 100, a first semiconductor chip 200, a first molding layer 300, a second redistribution substrate 400, and an adhesive film 800. The first redistribution substrate 100 may include an under-bump pattern 110, first redistribution patterns 150, first connection pads 120, and lower dielectric layers 101, 102, 103, and 104. The lower dielectric layers 101, 102, 103, and 104 may include a first lower dielectric layer 101, a second lower dielectric layer 102, a third lower dielectric layer 103, and a fourth lower dielectric layer 104.

The under-bump pattern 110 may be provided in the first lower dielectric layer 101. The first lower dielectric layer 101 may expose a bottom surface of the under-bump pattern 110 as shown in FIG. 1A. An external terminal 700 may be provided on the bottom surface of the under-bump pattern 110. The under-bump pattern 110 may define a position where the external terminal 700 is disposed. The under-bump pattern 110 may serve as a pad for the external terminal 700. The under-bump pattern 110 may include a metallic material, such as copper. The under-bump pattern 110 may not include, for example, titanium. The under-bump pattern 110 may be provided in plural, and the plurality of under-bump patterns 110 may be spaced apart from each other in a first direction D1. In this description, the first direction D1 may be parallel to a top surface of the first semiconductor chip 200, and a second direction D2 may be perpendicular to the top surface of the first semiconductor chip 200. For convenience of description, the following description uses a single under-bump pattern 110 as an example.

The first, second, third, and fourth lower dielectric layers 101, 102, 103, and 104 may be provided on (e.g., above in the direction D2) the under-bump pattern 110. The first lower dielectric layer 101 may cover top and lateral surfaces of the under-bump pattern 110. The first lower dielectric layer 101 may be a lowermost dielectric layer of the first, second, third, and fourth lower dielectric layers 101, 102, 103, and 104. The first lower dielectric layer 101 may not cover the bottom surface of the under-bump pattern 110. The first lower dielectric layer 101 may have a bottom surface 100b that corresponds to a bottom surface of the first redistribution substrate 100. The bottom surface 100b of the first lower dielectric layer 101 may be located at substantially the same level as that of the bottom surface of the under-bump pattern 110. For example, the bottom surface 100b of the first lower dielectric layer 101 may be coplanar with the bottom surface of the under-bump pattern 110. In this description, the term "level" may mean a vertical level, and a difference in level may be measured in a direction perpendicular to the bottom surface 100b of the first lower dielectric layer 101. The first lower dielectric layer 101 may include an organic material, such as a photosensitive polymer. In this description, the photosensitive polymer may include, for example, one or more of photosensitive polyimide, polybenzoxazole, phenolic polymers, and benzocyclobutene polymers. The first lower dielectric layer 101 may be a positive photosensitive polymer, but the disclosure is not limited thereto.

The second lower dielectric layer 102, the third lower dielectric layer 103, and the fourth lower dielectric layer 104 may be sequentially provided on the first lower dielectric layer 101. The second lower dielectric layer 102 may cover a top surface of the first lower dielectric layer 101. The third lower dielectric layer 103 may cover a top surface of the second lower dielectric layer 102. The fourth lower dielectric layer 104 may cover a top surface of the third lower dielectric layer 103. The first, second, third, and fourth lower dielectric layers 101, 102, 103, and 104 may include the same material as each other. The second, third, and fourth lower dielectric layers 102, 103, and 104 may include, for example, a photosensitive polymer. No distinct boundary may be provided between the first and second lower dielectric layers 101 and 102, between the second and third lower dielectric layers 102 and 103, or between the third and fourth lower dielectric layers 103 and 104, but the disclosure is not limited thereto. The first, second, third, and fourth lower dielectric layers 101, 102, 103, and 104 may have lateral surfaces that are vertically aligned with each other. The first redistribution substrate 100 may have a lateral surface 100c that includes the lateral surfaces of the first, second, third, and fourth lower dielectric layers 101, 102, 103, and 104.

The first redistribution patterns 150 may be provided on the top surface of each of the plurality of under-bump patterns 110. The first redistribution patterns 150 may be provided in the first, second, third, and fourth lower dielectric layers 101, 102, 103, and 104. The first redistribution patterns 150 may be surrounded by the first, second, third, and fourth lower dielectric layers 101, 102, 103, and 104. Each of the first redistribution patterns 150 may include a seed pattern 151 and a conductive pattern 153 disposed on the seed pattern 151. The seed pattern 151 may include a conductive material, such as copper, titanium, or an alloy thereof. The conductive pattern 153 may include a metallic material, such as copper.

Each of the first redistribution patterns 150 may include a via part 150V and a line part 150P. The line part 150P may be provided on (e.g., above in the direction D2) and connected to the via part 150V. The line part 150P may have a greater width or length than that of the via part 150V. The line part 150P may have a major axis that extends in the first direction D1. The line part 150P may extend parallel to the first direction D1, and the via part 150V may protrude from the line part 150P toward the bottom surface 100b of the first redistribution substrate 100. The first redistribution patterns 150 may be aligned to allow their via parts 150V to face the bottom surface 100b of the first redistribution substrate 100. The via part 150V of each of the first redistribution patterns 150 may be in contact with the top surface of one of the under-bump patterns 110 or with the line part 150P of an underlying first redistribution pattern 150. The line part 150P of each of the first redistribution patterns 150 may be in contact with the first connection pad 120 or with the via part 150V of an overlying first redistribution pattern 150.

For example, the via parts 150V of the first redistribution patterns 150 closest to the under-bump patterns 110 may correspondingly contact the top surfaces of the under-bump patterns 110. The conductive patterns 153 of the first redistribution patterns 150 may not directly contact the under-bump patterns 110. The seed patterns 151 may be correspondingly interposed between the conductive patterns 153 of the first redistribution patterns 150 and the top surfaces of the under-bump patterns 110. The seed patterns 151 may directly contact the top surfaces of the under-bump patterns 110. Alternatively, the via parts 150V of some of the first redistribution patterns 150 may correspondingly contact top surfaces of underlying first redistribution patterns 150.

The first connection pads 120 may be provided on adjacent first redistribution patterns 150. Each of the first connection pads 120 may include a seed pattern and a conductive pattern disposed on the seed pattern. The first connection pad 120 may include a via part that is connected to an underlying first redistribution pattern 150, and may also include a pad part on the via part. The pad part may be exposed by the fourth lower dielectric layer 104. The first connection pad 120 may define a position where either a lower connection terminal 250 or a conductive structure 310 is provided, the details of which will be described below. The first connection pad 120 may be coupled to the first redistribution pattern 150 underlying the first connection pad 120. For example, the first connection pad 120 may contact the conductive pattern 153 of the first redistribution pattern 150 underlying the first connection pad 120. The first connection pad 120 may include a conductive material. For example, the first connection pad 120 may include metal, such as copper, titanium, aluminum, tungsten, or any alloy thereof. No limitation is imposed on the number of the stacked first, second, third, and fourth lower dielectric layers 101, 102, 103, and 104 or the number of the stacked first redistribution patterns 150, and the numbers may be variously changed.

The first semiconductor chip 200 may be mounted on a top surface 100a of the first redistribution substrate 100. The first semiconductor chip 200 may include a first chip pad 205. The first chip pad 205 may be exposed on a bottom surface of the first semiconductor chip 200. The first semiconductor chip 200 may include integrated circuits therein. The integrated circuits may be disposed adjacent to the bottom surface of the first semiconductor chip 200. The integrated circuits may include a memory circuit, a logic circuit, or a combination thereof. The first chip pad 205 may be electrically connected to the integrated circuits. In this description, a component being "connected to" another component may include being physically connected to the other component, being electrically and directly connected to the other component, or being electrically and indirectly connected to the other component.

The lower connection terminal 250 may be provided between the first chip pad 205 of the first semiconductor chip 200 and the first connection pad 120 of the first redistribution substrate 100, thereby electrically connecting the first chip pad 205 to the first connection pad 120. The lower connection terminal 250 may include one or more of solder, pillar, and bump. The lower connection terminal 250 may include a conductive material, such as a solder material. The solder material may include, for example, tin, bismuth, lead, silver, or any alloy thereof. The first semiconductor chip 200 may be electrically connected through the lower connection terminal 250 to the first redistribution substrate 100. For example, the lower connection terminal 250 may be electrically connected to at least one of the first redistribution patterns 150 of the first redistribution substrate 100.

The conductive structure 310 may be provided on the top surface 100a of the first redistribution substrate 100. The conductive structure 310 may be disposed on the first connection pad 120, and may be coupled to both the first connection pad 120 and a connection terminal 405 of a second redistribution substrate 400 as described in detail below. For example, the conductive structure 310 may have a top surface 310a in contact with the connection terminal 405 and the adhesive film 800, and may also have a bottom surface in contact with the first connection pad 120. The conductive structure 310 may be spaced apart in the first direction D1 from the first semiconductor chip 200. When viewed in plan, the conductive structure 310 may be provided on an edge region of the first redistribution substrate 100. For example, the conductive structure 310 may extend in the second direction D2 to thereby connect the first redistribution substrate 100 to the second redistribution substrate 400. The conductive structure 310 may be electrically connected through the first redistribution substrate 100 to the first semiconductor chip 200. The conductive structure 310 may include metal, such as copper.

A first under-fill layer 230 may be provided between the first semiconductor chip 200 and the top surface 100a of the first redistribution substrate 100. The first under-fill layer 230 may seal the lower connection terminal 250. The first under-fill layer 230 may include a dielectric polymer, such as an epoxy-based polymer.

The first molding layer 300 may be disposed on the first redistribution substrate 100, thereby covering the first semiconductor chip 200. For example, the first molding layer 300 may cover top and lateral surfaces of the first semiconductor chip 200 and lateral surfaces of the first under-fill layer 230. In this case, the top surface of the semiconductor chip 200 may be defined as the surface facing away from the first redistribution substrate 100 as shown in FIG. 1A. The first molding layer 300 may fill gaps between the first semiconductor chip 200 and the conductive structure 310 and between a plurality of conductive structures 310. The first molding layer 300 may cover an uppermost dielectric layer of the first, second, third, and fourth lower dielectric layers 101, 102, 103, and 104. The uppermost dielectric layer may be the fourth lower dielectric layer 104. The first molding layer 300 may include a dielectric polymer, such as an epoxy-based molding compound. Alternatively, the first under-fill layer 230 may be omitted, and the first molding layer 300 may further extend into a gap between the first semiconductor chip 200 and the first redistribution substrate 100, thereby sealing the lower connection terminal 250.

The first molding layer 300 may have a top surface 300a at a higher level than that of the top surface of the first semiconductor chip 200. The top surface 300a of the first molding layer 300 may be located at substantially the same level as that of the top surface 310a of the conductive structure 310. For example, the top surface 300a of the first molding layer 300 may be coplanar with the top surface 310a of the conductive structure 310. The first molding layer 300 may have lateral surfaces 300c that are vertically aligned with corresponding lateral surfaces 100c of the first redistribution substrate 100. In other words, the lateral surfaces 300c of the first molding layer 300 may be coplanar with the corresponding lateral surfaces 100c of the first redistribution substrate 100.

The external terminal 700 may be provided on a bottom surface 100b of the first redistribution substrate 100. For example, the external terminal 700 may be disposed on the bottom surface of the under-bump pattern 110, and may be electrically connected to the under-bump pattern 110. The external terminal 700 may directly contact the under-bump pattern 110. Therefore, the external terminal 700 may be electrically connected to the first semiconductor chip 200 through the redistribution patterns 150 of the first redistribution substrate 100 and the lower connection terminal 250 of the first semiconductor chip 200. The external terminal 700 may include a solder, a bump, a pillar, or any combination thereof. The external terminal 700 may include a solder material. As shown in FIG. 1A, a pitch between a plurality of external terminals 700 may be greater than a pitch between a plurality of lower connection terminals 250.

The adhesive film 800 may be provided on the top surface 300a of the first molding layer 300 and the top surface 310a of the conductive structure 310. The adhesive film 800 may extend parallel to the first direction D1, thereby covering the top surface 300a of the first molding layer 300 and the top surface 310a of the conductive structure 310. The adhesive film 800 will be further discussed in detail below.

The second redistribution substrate 400 may be provided on the adhesive film 800. The second redistribution substrate 400 may include a second lower connection pad 410, a second upper connection pad 420, second redistribution patterns 450, first, second, and third upper dielectric layers 401, 402, and 403, and a connection terminal 405.

The second lower connection pad 410 may be provided in the first upper dielectric layer 401. The first upper dielectric layer 401 may cover lateral surfaces of the second lower connection pad 410, but may not cover a bottom surface of the second lower connection pad 410. This configuration may expose the bottom surface of the second lower connection pad 410. The connection terminal 405 may be provided on the bottom surface of the second lower connection pad 410. The second lower connection pad 410 may be vertically aligned with the connection terminal 405 and the conductive structure 310. The second lower connection pad 410 may define a position where the connection terminal 405 is disposed. The second lower connection pad 410 may include a metallic material, such as copper. The second lower connection pad 410 may not include, for example, titanium. The second lower connection pad 410 may be provided in plural, and the plurality of second lower connection pads 410 may be spaced apart from each other in the first direction D1.

The first, second, and third upper dielectric layers 401, 402, and 403 may be provided on (e.g., above in the direction D2) the second lower connection pad 410. The first upper dielectric layer 401 may cover the lateral surfaces of the second lower connection pad 410 and a portion of a top surface of the second lower connection pad 410. The first upper dielectric layer 401 may be a lowermost dielectric layer of the first, second, and third upper dielectric layers 401, 402, and 403. The first upper dielectric layer 401 may not cover the bottom surface of the second lower connection pad 410. The first upper dielectric layer 401 may have a bottom surface 400b that corresponds to a bottom surface of the second redistribution substrate 400. The bottom surface 400b of the first upper dielectric layer 401 may be coplanar with the bottom surface of the second lower connection pad 410. The first upper dielectric layer 401 may include an organic material, such as a photosensitive polymer. The first upper dielectric layer 401 may be a positive photosensitive polymer, but the disclosure is not limited thereto.

The second and third upper dielectric layers 402 and 403 may be sequentially provided on the first upper dielectric layer 401. The second upper dielectric layer 402 may cover a top surface of the first upper dielectric layer 401. The third upper dielectric layer 403 may cover a top surface of the second upper dielectric layer 402. The second and third upper dielectric layers 402 and 403 may include the same material as that of the first upper dielectric layer 401. The second and third upper dielectric layers 402 and 403 may include, for example, a photosensitive polymer. No distinct boundary may be provided between the first and second upper dielectric layers 401 and 402 or between the second and third upper dielectric layers 402 and 403, but the disclosure is not limited thereto. The first, second, and third upper dielectric layers 401, 402, and 403 may have sidewalls that are vertically aligned (e.g., coplanar) with each other. The second redistribution substrate 400 may have a lateral surface 400c that includes the sidewalls of the first, second, and third upper dielectric layers 401, 402, and 403.

The second redistribution patterns 450 may be provided on the top surface of each of the plurality of second lower connection pads 410. The second redistribution patterns 450 may be provided in the first, second, and third upper dielectric layers 401, 402, and 403. The second redistribution patterns 450 may be surrounded by the first, second, and third upper dielectric layers 401, 402, and 403. Each of the second redistribution patterns 450 may include a seed pattern 451 and a conductive pattern 453 disposed on the seed pattern 451. The seed pattern 451 may include a conductive material, such as copper, titanium, or an alloy thereof. The conductive pattern 453 may include a metallic material, such as copper.

Each of the second redistribution patterns 450 may include a via part 450V and a line part 450P. The via part 450V and the line part 450P of each of the second redistribution patterns 450 may be substantially the same as the via part 150V and the line part 150P of each of the first redistribution patterns 150.

The line part 450P may be provided on and connected to the via part 450V. The line part 450P may have a major axis that extends in the first direction D1. The line part 450P may extend parallel to the first direction D1, and the via part 450V may protrude from the line part 450P toward the bottom surface 400b of the second redistribution substrate 400. Each of the second redistribution patterns 450 may be aligned to allow their via parts 450V to face the bottom surface 400b of the second redistribution substrate 400. The via part 450V of each of the second redistribution patterns 450 may be in contact with the top surface of the second lower connection pad 410 or with the line part 450P of an underlying second redistribution pattern 450. The line part 450P of each of the second redistribution patterns 450 may be in contact with the second connection pad 420 or with the via part 450V of an overlying second redistribution pattern 450.

For example, the via parts 450V of the second redistribution patterns 450 closest to the second lower connection pads 410 may correspondingly contact the top surfaces of the second lower connection pads 410. The conductive patterns 453 of the second redistribution patterns 450 may not directly contact the second lower connection pad 410. The seed patterns 451 may be correspondingly interposed between the conductive patterns 453 of the second redistribution patterns 450 and the top surfaces of the second lower connection pads 410. The seed patterns 451 may directly contact the top surfaces of the second lower connection pads 410. Alternatively, the via parts 450V of some of the second redistribution patterns 450 may correspondingly contact top surfaces of underlying redistribution patterns 450.

A second upper connection pad 420 may be provided in the third upper dielectric layer 403. The third upper dielectric layer 403 may be an uppermost dielectric layer of the first, second, and third upper dielectric layers 401, 402, and 403. The third upper dielectric layer 403 may cover lateral surfaces of the second upper connection pad 420, but may not cover a top surface of the second upper connection pad 420. The second upper connection pad 420 may define a position where an upper connection terminal 550 is provided. The second upper connection pad 420 may be coupled to the second redistribution pattern 450 adjacent thereto. For example, the second upper connection pad 420 may contact the conductive pattern 453 of the second redistribution pattern 450 adjacent thereto. The second upper connection pad 420 may include a conductive material. For example, the second upper connection pad 420 may include metal, such as copper, titanium, aluminum, tungsten, or any alloy thereof. The number of the first, second, and third upper dielectric layers 401, 402, and 403 and the number of the second redistribution patterns 450 may be variously changed without being limited to that shown.

In an embodiment, the via parts 450V of the second redistribution patterns 450 may be aligned to face the top surface 400a of the second redistribution substrate 400. For example, the via part 450V may be provided on and connected to the line part 450P. The line part 450P may extend parallel to the first direction D1, and the via part 450V may protrude from the line part 450P toward the top surface 400a of the second redistribution substrate 400. The line part 450P of each of the second redistribution patterns 450 may be in contact with the second lower connection pad 410 or with the via part 450V of an underlying second redistribution pattern 450. The via part 450V of each of the second redistribution patterns 450 may be in contact with the second upper connection pad 420 or with the line part 450P of an overlying second redistribution pattern 450. For example, the second upper connection pad 420 may include a pad part and a via part provided on the pad part. The pad part of the second upper connection pad 420 may be connected to the via part 450V of one of adjacent second redistribution patterns 450. In this case, the upper connection terminal 550 may be omitted on the second upper connection pad 420. Therefore, second upper connection pad 420 may contact a second chip pad 505 of a second semiconductor chip 500 which will be discussed below.

According to some example embodiments, the first redistribution substrate 100 may have a thickness H1 in the second direction D2 identical to or greater than a thickness H2 in the second direction D2 of the second redistribution substrate 400. A value of about 5 μm to about 50 μm may be given as the thickness H1 in the second direction D2 of the first redistribution substrate 100 and the thickness H2 in the second direction D2 of the second redistribution substrate 400.

A second semiconductor chip 500 may be mounted on a top surface 400a of the second redistribution substrate 400. The second semiconductor chip 500 may include a second chip pad 505. The second chip pad 505 may be exposed on a bottom surface of the second semiconductor chip 500. The second semiconductor chip 500 may include integrated circuits therein. The integrated circuits may be disposed adjacent to the bottom surface of the second semiconductor chip 500. The integrated circuits may include a memory circuit, a logic circuit, or a combination thereof. The second chip pad 505 may be electrically connected to the integrated circuits. In this description, a component being "connected to" another component may include being physically connected to the other component, being electrically and directly connected to the other component, or being electrically and indirectly connected to the other component.

The upper connection terminal 550 may be provided between the second chip pad 505 of the second semiconductor chip 500 and the second upper connection pad 420 of the second redistribution substrate 400, thereby electrically connecting the second chip pad 505 to the second upper connection pad 420. The upper connection terminal 550 may be substantially the same as the lower connection terminal 250. The second semiconductor chip 500 may be electrically connected through the upper connection terminal 550 to the second redistribution substrate 400. For example, the upper connection terminal 550 may be electrically connected to at least one of the second redistribution patterns 450 of the second redistribution substrate 400.

A second molding layer 600 may be disposed on the second redistribution substrate 400, thereby covering the second semiconductor chip 500. For example, the second molding layer 600 may cover top and lateral surfaces of the second semiconductor chip 500. The second molding layer 600 may further extend into a gap between the second semiconductor chip 500 and the second redistribution substrate 400, thereby sealing the upper connection terminal 550. The second molding layer 600 may cover an uppermost dielectric layer of the first, second, and third upper dielectric layers 401, 402, and 403. The uppermost dielectric layer may be the third upper dielectric layer 403. The second molding layer 600 may have lateral surfaces 600c that are vertically aligned with corresponding lateral surfaces 400c of the second redistribution substrate 400. The lateral surfaces 600c of the second molding layer 600 may be coplanar with the corresponding lateral surfaces 400c of the second redistribution substrate 400. The second molding layer 600 may include the same material as that of the first molding layer 300. The second molding layer 600 may include a dielectric polymer, such as an epoxy-based molding compound. Alternatively, an under-fill layer may further be interposed in a gap between the second redistribution substrate 400 and the second semiconductor chip 500.

Referring to FIG. 1B, the connection terminal 405 may be interposed between the conductive structure 310 and the second lower connection pad 410. The connection terminal 405 may be vertically aligned with the conductive structure 310. The connection terminal 405 may contact the top surface 310a of the conductive structure 310 and a bottom surface 410b of the second lower connection pad 410, and may electrically connect the conductive structure 310 to the second redistribution patterns 450. The connection terminal 405 may penetrate the adhesive film 800. The connection terminal 405 may have a lateral surface surrounded by the adhesive film 800. The lateral surface of the connection terminal 405 may directly contact the adhesive film 800.

The connection terminal 405 may include a first part 405U and a second part 405B. The first part 405U may be provided on and connected to the second part 405B. The second part 405B may surround a lower portion of the first part 405U. The first part 405U may include a solder, a bump, a pillar, or any combination thereof. The first part 405U may include a conductive material, such as metal. The second part 405B may include a metallic material, such as tin or indium. For example, the first part 405U may include the same material as that of the second part 405B. For another example, the first part 405U may include a different material from that of the second part 405B. For example, the first part 405U and the second part 405B may have an indistinct boundary therebetween, but the disclosure is not limited thereto.

According to some example embodiments, as shown in FIG. 1B, the connection terminal 405 may have a maximum width W1 in the first direction D1 less than a width W2 in the first direction D1 of the conductive structure 310. For example, a value of about 0.4 to about 0.8 may be given as a ratio of the maximum width W1 in the first direction D1 of the connection terminal 405 to the width W2 in the first direction D1 of the conductive structure 310. Therefore, the top surface 310a of the conductive structure 310 may contact both the connection terminal 405 and the adhesive film 800.

According to some example embodiments, as shown in FIG. 1C, the connection terminal 405 may have a maximum width W1' in the first direction D1 substantially the same as the width W2 in the first direction D1 of the conductive structure 310. Therefore, the second part 405B of the connection terminal 405 may cover the entirety of the top surface 310a of the conductive structure 310. The top surface 310a of the conductive structure 310 may contact the connection terminal 405, but may not contact the adhesive film 800.

Referring back to FIG. 1A, the adhesive film 800 may be interposed between the first molding layer 300 and the second redistribution substrate 400. The adhesive film 800 may extend parallel to the first direction D1, and may fill a gap between the top surface 300a of the first molding layer 300 and the bottom surface 400b of the second redistribution substrate 400. The adhesive film 800 may cover the entirety of the top surface 300a of the first molding layer 300. The adhesive film 800 may surround a lateral surface of the connection terminal 405 and may seal the connection terminal 405. The adhesive film 800 may contact the top surface 300a of the first molding layer 300, the top surface 310a of the conductive structure 310, the bottom surface 400b of the second redistribution substrate 400, the bottom surface 410b of the second upper connection pad 410, and the lateral surface of the connection terminal 405. The adhesive film 800 may include a dielectric material. For example, the adhesive film 800 may include one or more of an adhesive polymer, a thermo-curable polymer, and a dielectric polymer. The adhesive film 800 may serve to attach and fix the second redistribution substrate 400 to the first molding layer 300.

Figure 2:
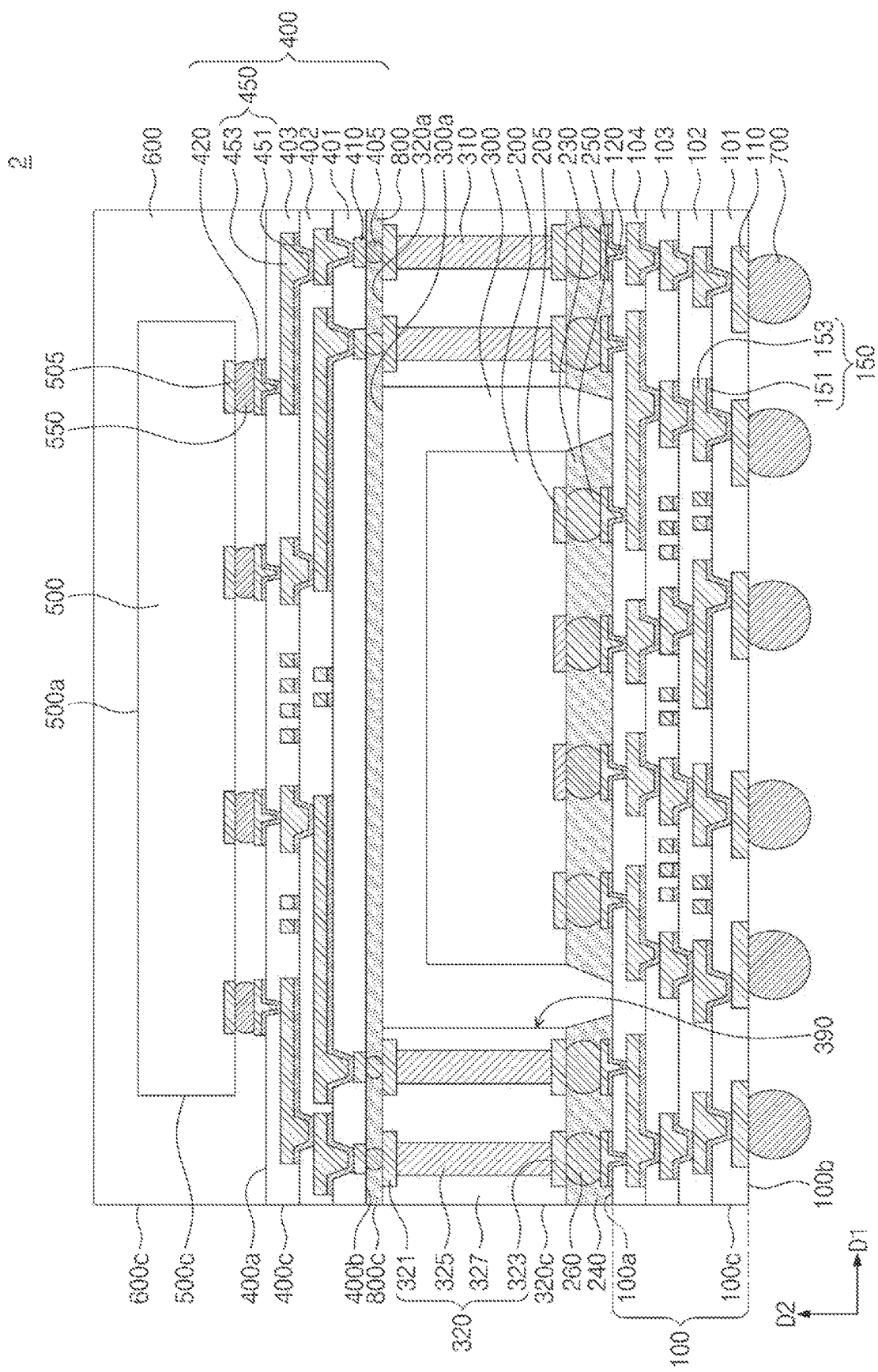
FIG. 2 illustrates a cross-sectional view showing a semiconductor package according to an embodiment.

The adhesive film 800 may have a lateral surface 800c that is vertically aligned with the lateral surface 100c of the first redistribution substrate 100, the lateral surface 400c of the second redistribution substrate 400, the lateral surface 300c of the first molding layer 300, and the lateral surface 600c of the second molding layer 600. For example, the lateral surface 800c of the adhesive film 800 may be coplanar with the lateral surface 400c of the second redistribution substrate 400 and with the lateral surface 300c of the first molding layer 300. The adhesive film 800 may have a width W0 in the first direction D1 the same as a width in the first direction D1 of the first redistribution substrate 100. Although not shown, according to some example embodiments, an adhesive film may further be provided on the second molding layer 600. Either a redistribution substrate or a semiconductor package may further be provided on the adhesive film 800. Therefore, there may be provided a semiconductor package including a plurality of stacked packages. FIG. 2 illustrates a cross-sectional view showing a semiconductor package according to some example embodiments. Those discussed above will not be described while differences will be discussed in detail below.

Referring to FIG. 2, a semiconductor package 2 according to some example embodiments may include a first redistribution substrate 100, a first semiconductor chip 200, a first molding layer 300, a second redistribution substrate 400, a second semiconductor chip 500, and an adhesive film 800, and may further include a connection substrate 320. The first redistribution substrate 100, the first semiconductor chip 200, the second redistribution substrate 400, the second semiconductor chip 500, and the adhesive film 800 may be substantially the same as those discussed in FIGS. 1A and 1B.

The connection substrate 320 may be disposed on the first redistribution substrate 100. The connection substrate 320 may have a substrate hole 390 that penetrates therethrough. For example, the substrate hole 390 may be formed to penetrate top and bottom surfaces of a printed circuit board, which may constitute the connection substrate 320. When viewed in plan, the substrate hole 390 may be formed on a central portion of the first redistribution substrate 100. The first semiconductor chip 200 may be disposed in the substrate hole 390 of the connection substrate 320. The first semiconductor chip 200 may be spaced apart from an inner wall of the connection substrate 320.

The connection substrate 320 may include a base layer 327 and a conductive structure 321, 323, and 325. The base layer 327 may include a single layer or a plurality of stacked layers. The base layer 327 may include a dielectric material. For example, the base layer 327 may include a carbon-based material, a ceramic, or a polymer. The substrate hole 390 may penetrate the base layer 327. The conductive structure 321, 323, and 325 may be provided in the base layer 327. The conductive structure 321, 323, and 325 may include a first pad 321, a conductive via 325, and a second pad 323. The first pad 321 may be exposed on a top surface of the connection substrate 320, and the second pad 323 may be exposed on a bottom surface of the connection substrate 320. The conductive via 325 may be provided between the first pad 321 and the second pad 323. The conductive via 325 may penetrate the base layer 327, and may be coupled to the first pad 321 and the second pad 323. The second pad 323 may be electrically connected through the conductive via 325 to the first pad 321. The first pad 321, the second pad 323, and the conductive via 325 may be vertically aligned with each other, but the disclosure is not limited thereto. The conductive structure 321, 323, and 325 may include metal. The conductive structure 321, 323, and 325 may include, for example, copper, aluminum, tungsten, titanium, tantalum, iron, or any alloy thereof.

A connection bump 260 may be disposed between the first redistribution substrate 100 and the connection substrate 320. The connection bump 260 may be interposed between and coupled to the second pad 323 and its corresponding first connection pad 120. The conductive structure 321, 323, and 325 may be electrically connected through the connection bump 260 to the first redistribution substrate 100. The connection bump 260 may include one or more of a solder ball, a bump, and a pillar. The connection bump 260 may include a metallic material. A second under-fill layer 240 may be provided in a gap between the first redistribution substrate 100 and the connection substrate 320, thereby sealing the connection bump 260. The second under-fill layer 240 may include a dielectric polymer.

The first molding layer 300 may fill the substrate hole 390 of the connection substrate 320. For example, the first molding layer 300 may fill a gap between the first semiconductor chip 200 and the connection substrate 320. The first molding layer 300 may cover the top and lateral surfaces of the first semiconductor chip 200, the lateral surface of the first under-fill layer 230, a lateral surface of the second under-fill layer 240, and an inner wall of the connection substrate 320. The top surface 300a of the first molding layer 300 may be located at the same level as that of a top surface 320a of the connection substrate 320. For example, the top surface 300a of the first molding layer 300 may be coplanar with the top surface 320a of the connection substrate 320. The first molding layer 300 may include a dielectric polymer, such as an epoxy-based polymer. For example, the first molding layer 300 may include an adhesive dielectric film such as an Ajinomoto build-up film (ABF).

The adhesive film 800 may be provided on the top surface 300a of the first molding layer 300 and the top surface 320a of the connection substrate 320. The adhesive film 800 may extend parallel to the first direction D1, and may cover the top surface 300a of the first molding layer 300 and the top surface 320a of the connection substrate 320. The lateral surface 800c of the adhesive film 800 may be vertically aligned with a lateral surface 320c of the connection substrate 320. For example, the lateral surface 800c of the adhesive film 800 may be coplanar with the lateral surface 320c of the connection substrate 320.

The connection terminal 405 may be provided on a first pad 321 of the connection substrate 320. The connection terminal 405 may be vertically aligned with the first pad 321. The connection terminal 405 may be coupled to the first pad 321, and may thus electrically connect the second redistribution substrate 400 to the connection substrate 320. The connection terminal 405 may be surrounded by the adhesive film 800.

Figure 3:
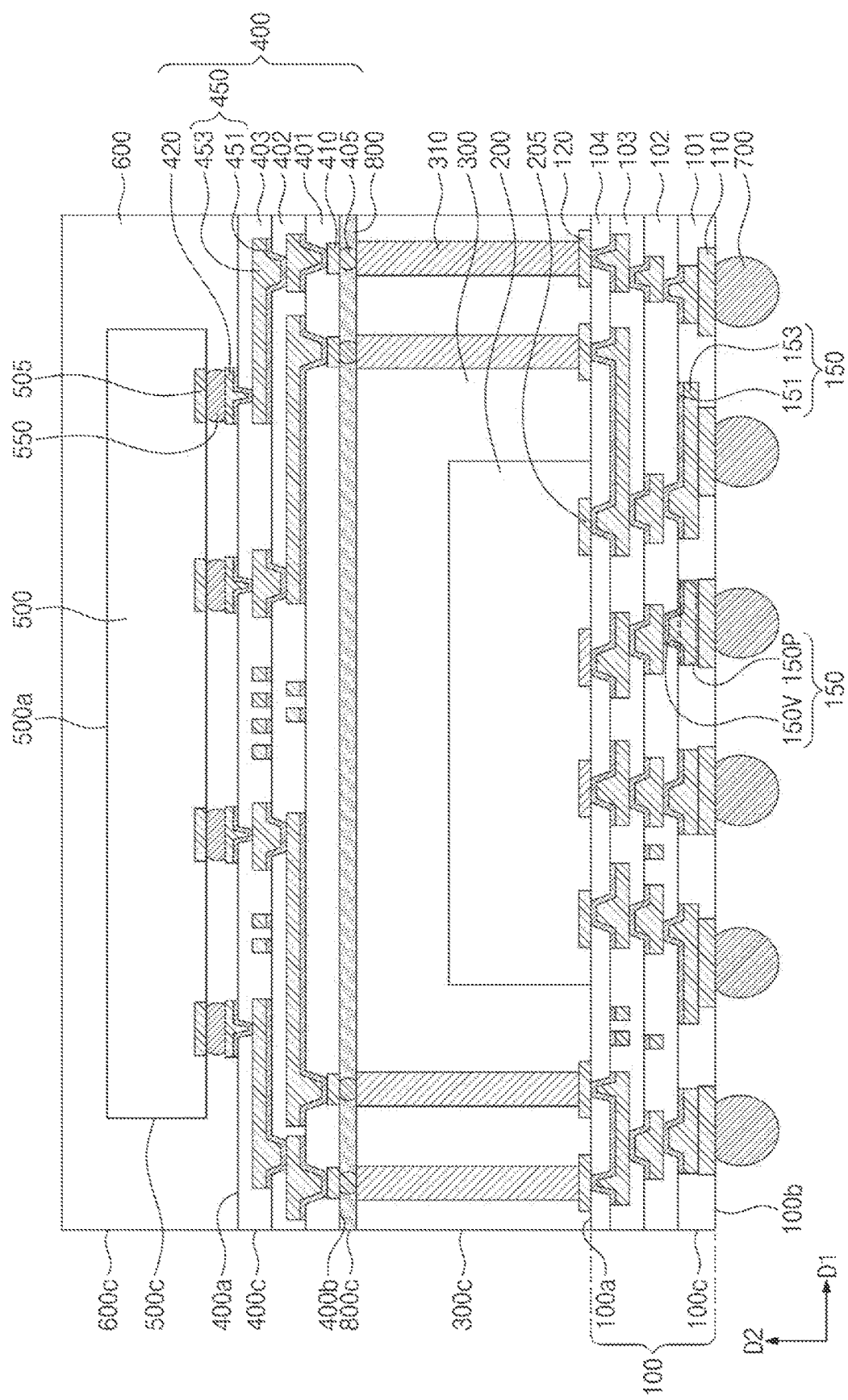
FIG. 3 illustrates a cross-sectional view showing a semiconductor package according to an embodiment.

FIG. 3 illustrates a cross-sectional view showing a semiconductor package according to some example embodiments. Those discussed above will not be described while differences will be discussed in detail below.

Referring to FIG. 3, a semiconductor package 3 according to some example embodiments may include a first redistribution substrate 100, a first semiconductor chip 200, a first molding layer 300, a second redistribution substrate 400, and an adhesive film 800. The first molding layer 300, the second redistribution substrate 400, and the adhesive film 800 may be substantially the same as those discussed in FIGS. 1A and 1B. In contrast, neither the first under-fill layer 230 nor the lower connection terminal 250 may be provided.

The first redistribution substrate 100 may include an under-bump pattern 110, first redistribution patterns 150, first connection pads 120, and lower dielectric layers 101, 102, 103, and 104. The lower dielectric layers 101, 102, 103, and 104 may include a first lower dielectric layer 101, a second lower dielectric layer 102, a third lower dielectric layer 103, and a fourth lower dielectric layer 104. The under-bump pattern 110 and the lower dielectric layers 101, 102, 103, and 104 may be substantially the same as those discussed in FIGS. 1A and 1B.

The first redistribution patterns 150 may be provided on the top surface of each of the plurality of under-bump patterns 110. The first redistribution patterns 150 may be provided in the first, second, third, and fourth lower dielectric layers 101, 102, 103, and 104. The first redistribution patterns 150 may be surrounded by the first, second, third, and fourth lower dielectric layers 101, 102, 103, and 104. Each of the first redistribution patterns 150 may include a conductive pattern 153 and a seed pattern 151 disposed on the conductive pattern 153. The seed pattern 151 may include a conductive material, such as copper, titanium, or an alloy thereof. The conductive pattern 153 may include a metallic material, such as copper.

Each of the first redistribution patterns 150 may include a via part 150V and a line part 150P. The via part 150V may be provided on and connected to the line part 150P. The line part 150P may have a greater width or length than that of the via part 150V. The line part 150P may have a major axis that extends in the first direction D1. The line part 150P may extend parallel to the first direction D1, and the via part 150V may protrude from the line part 150P toward the top surface 100a of the first redistribution substrate 100. The first redistribution patterns 150 may be aligned to allow their via parts 150V to face the top surface 100a of the first redistribution substrate 100. The line part 150P of each of the first redistribution patterns 150 may be in contact with the top surface of one of the under-bump patterns 110 or with the via part 150V of an underlying first redistribution pattern 150. The via part 150V of each of the first redistribution patterns 150 may be in contact with the first connection pad 120 or with the line part 150P of an overlying first redistribution pattern 150.

For example, the line parts 150P of the first redistribution patterns 150 closest to the under-bump patterns 110 may contact corresponding top surfaces of the under-bump patterns 110. The conductive patterns 153 of the first redistribution patterns 150 closest to the under-bump patterns 110 may directly contact the corresponding top surfaces of the under-bump patterns 110. The seed patterns 151 may be correspondingly interposed between the conductive patterns 153 of the first redistribution patterns 150 and the conductive patterns 153 of overlying first redistribution patterns 150. Alternatively, the via parts 150V of some of the first redistribution patterns 150 may contact corresponding bottom surfaces of overlying first redistribution patterns 150.

The first connection pad 120 may be provided on the fourth lower dielectric layer 104. The first connection pad 120 may be interposed between the conductive structure 310 and the first redistribution patterns 150, thereby electrically connecting the conductive structure 310 to the first redistribution patterns 150. The first connection pad 120 may contact the via part 150V of at least one of the first redistribution patterns 150. The first connection pad 120 may include metal, such as copper, titanium, aluminum, tungsten, or any alloy thereof.

The first semiconductor chip 200 may be mounted on the top surface 100a of the first redistribution substrate 100. The first semiconductor chip 200 may include a first chip pad 205. The first chip pad 205 may be exposed on a bottom surface of the first semiconductor chip 200. The first semiconductor chip 200 may include integrated circuits therein. The integrated circuits may be disposed adjacent to the bottom surface of the first semiconductor chip 200. The integrated circuits may include a memory circuit, a logic circuit, or a combination thereof. The first chip pad 205 may be electrically connected to the integrated circuits. In this description, a component being "connected to" another component may include being physically connected to the other component, being electrically and directly connected to the other component, or being electrically and indirectly connected to the other component. The first chip pad 205 may be connected to at least one of the first redistribution patterns 150 included in the first redistribution substrate 100. For example, the first chip pad 205 may have a bottom surface in contact with the via part 150V of at least one of the first redistribution patterns 150. Therefore, the first semiconductor chip 200 may be electrically connected to the first redistribution substrate 100.

Figure 4:
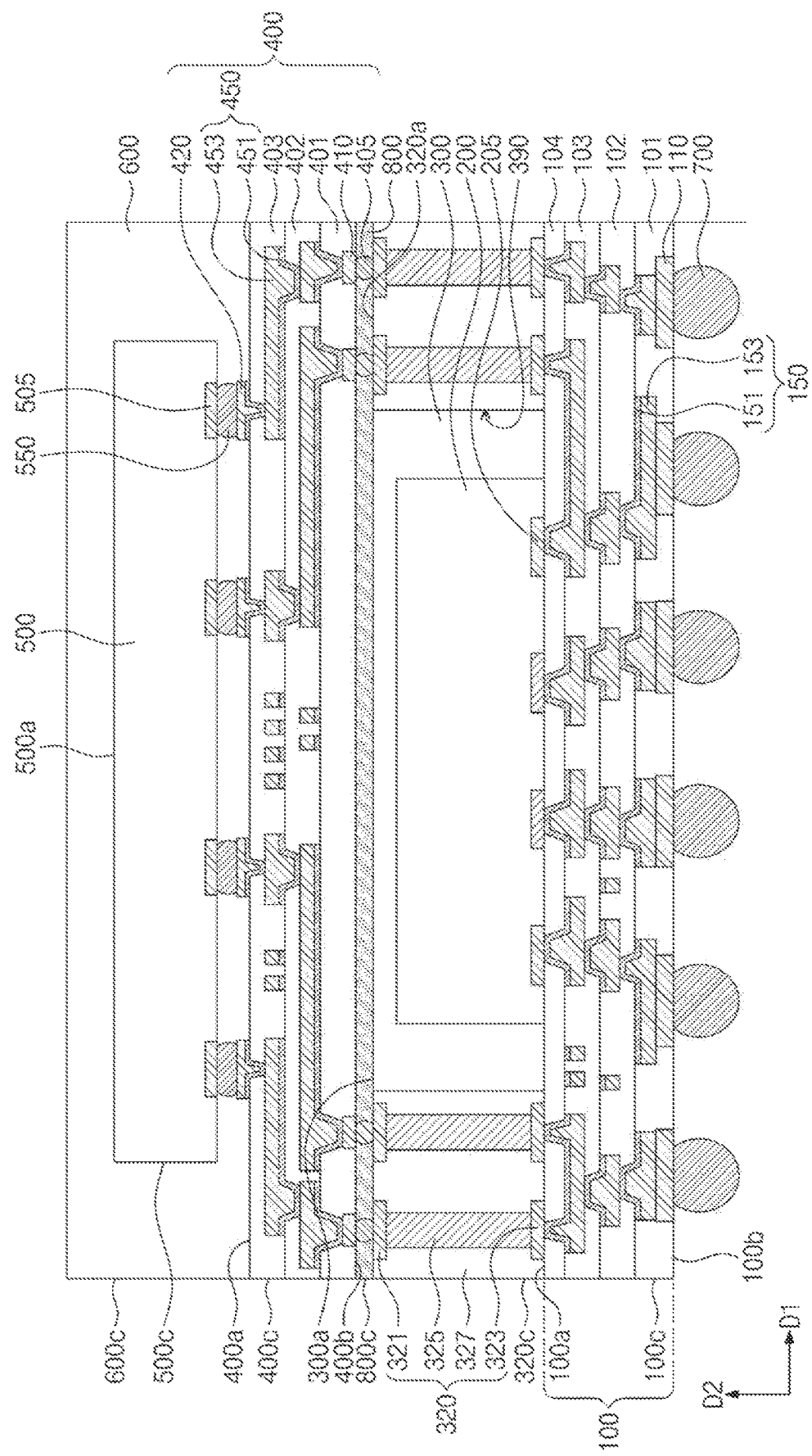
FIG. 4 illustrates a cross-sectional view showing a semiconductor package according to an embodiment.

FIG. 4 illustrates a cross-sectional view showing a semiconductor package according to some example embodiments. Those discussed above will not be described while differences will be discussed in detail below.

Referring to FIG. 4, a semiconductor package 4 according to some example embodiments may include a first redistribution substrate 100, a first semiconductor chip 200, a first molding layer 300, a second redistribution substrate 400, a second semiconductor chip 500, and an adhesive film 800, and may further include a connection substrate 320. The first redistribution substrate 100 and the first semiconductor chip 200 may be substantially the same as that discussed in FIG. 3. The first molding layer 300 may be substantially the same as that discussed in FIG. 2. The second redistribution substrate 400 and the second semiconductor chip 500 may be substantially the same as those discussed in FIGS. 1A and 1B. The adhesive film 800 may be substantially the same as that discussed in FIG. 2. The connection substrate 320 may be similar to that discussed in FIG. 2.

The connection substrate 320 may be disposed on the first redistribution substrate 100. The connection substrate 320 may have a substrate hole 390 that penetrates therethrough. For example, the substrate hole 390 may be formed to penetrate top and bottom surfaces of a printed circuit board, which may constitute the connection substrate 320. When viewed in plan, the substrate hole 390 may be formed on a central portion of the first redistribution substrate 100. The first semiconductor chip 200 may be disposed in the substrate hole 390 of the connection substrate 320. The first semiconductor chip 200 may be spaced apart from an inner wall of the connection substrate 320.

The connection substrate 320 may include a base layer 327 and a conductive structure 321, 323, and 325. The conductive structure 321, 323, and 325 may include a first pad 321, a conductive via 325, and a second pad 323. Neither a connection bump nor an under-fill layer may be provided between the connection substrate 320 and the first redistribution substrate 100. The connection substrate 320 may have a bottom surface at the same level as that of the top surface 100a of the first redistribution substrate 100. For example, the second pad 323 may be connected to at least one of the first redistribution patterns 150. In such a configuration, the second pad 323 may contact the via part 150V of at least one one of the first redistribution patterns 150.

[Fabrication Method]

FIGS. 5 to 10, 12, and 13 illustrate cross-sectional views showing a method of fabricating a semiconductor package according to some example embodiments. FIG. 11 illustrates an enlarged view showing section B of FIG. 10.

Figure 5:
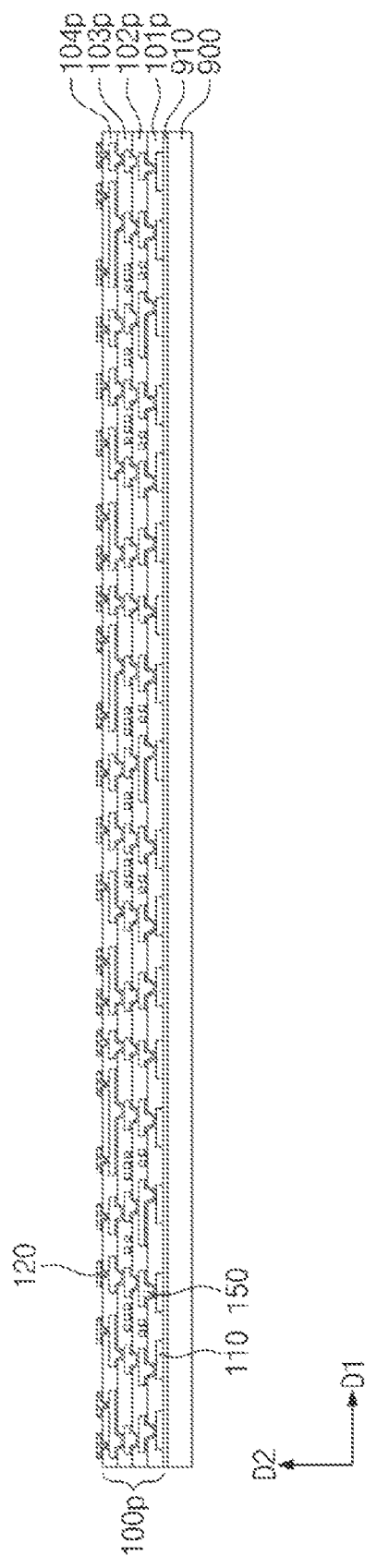
FIGS. 5 to 10, 12, and 13 illustrate cross-sectional views showing a method of fabricating a semiconductor package according to embodiments.

Referring to FIG. 5, a first preliminary redistribution substrate 100p may be formed on a carrier substrate 900. A release layer 910 may be interposed between the carrier substrate 900 and an under-bump pattern 110 and between the carrier substrate 900 and a first preliminary lower dielectric layer 101p. The release layer 910 may attach the first preliminary redistribution substrate 100p to the carrier substrate 900. The formation of the first preliminary redistribution substrate 100p may include forming a seed layer, forming on the seed layer a resist pattern having an opening, using the seed layer as an electrode to form a conductive layer in the opening, removing the resist pattern, patterning the seed layer, depositing a dielectric layer, and performing a patterning process.

For example, a seed layer may be formed on the release layer 910. The seed layer may cover a top surface of the release layer 910. A deposition process may be performed to form the seed layer. The seed layer may include a conductive material. For example, the seed layer may include copper, titanium, or an alloy thereof.

A resist pattern having an opening may be formed on the seed layer. The opening may define a shape of an under-bump pattern 110. The opening of the resist pattern may expose a top surface of the seed layer. The resist pattern may include a photoresist material.

The seed layer in the opening may be used as an electrode to form the under-bump pattern 110. The under-bump pattern 110 may be formed by performing an electroplating process in which the seed layer is used as an electrode. The electroplating process may terminate before the under-bump pattern 110 extends onto a top surface of the resist pattern. A strip process may be performed to remove the resist pattern. Therefore, the seed layer may be externally exposed below the resist pattern.

The exposed seed layer may undergo an etching process to pattern the seed layer. The top surface of the release layer 910 may be exposed between a plurality of under-bump patterns 110. The first preliminary lower dielectric layer 101p may be formed on the under-bump pattern 110. The first preliminary lower dielectric layer 101p may conformally cover the exposed release layer 910 and top and lateral surfaces of the under-bump pattern 110. The first preliminary lower dielectric layer 101p may be formed by a coating process, such as spin coating or slit coating. The first preliminary lower dielectric layer 101p may be patterned to form a via hole where a via part of a first redistribution pattern 150 will be formed. The first preliminary lower dielectric layer 101p may undergo a curing process to rigidly cure the first preliminary lower dielectric layer 101p. The processes above may be repeatedly performed to form the first preliminary redistribution substrate 100p that includes stacked first, second, third, and fourth preliminary lower dielectric layers 101p, 102p, 103p, and 104p. First connection pads 120 may be formed on the first preliminary redistribution substrate 100p. The first connection pads 120 may be exposed on the fourth preliminary lower dielectric layer 104p.

Figure 6:
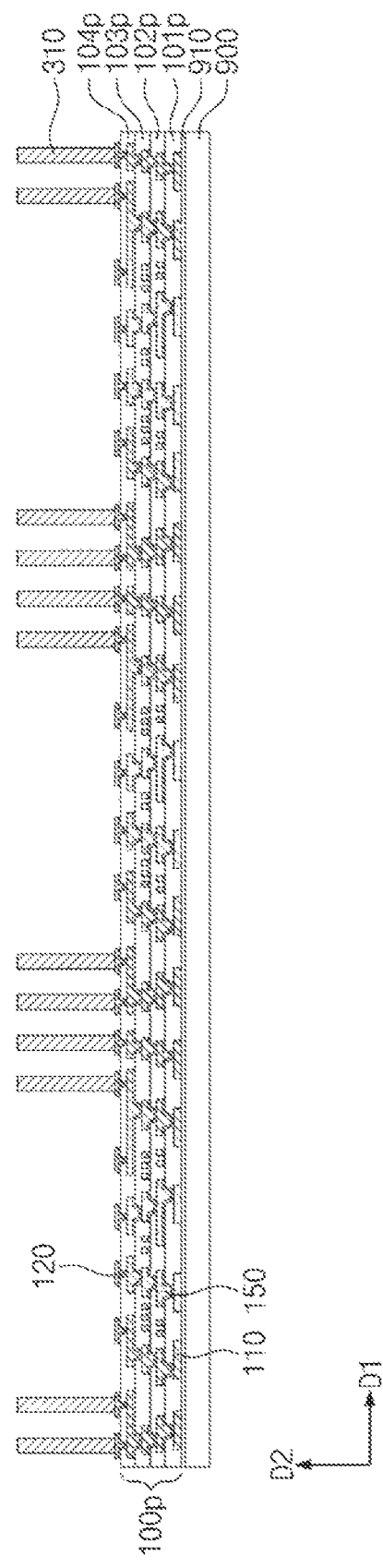

Referring to FIG. 6, conductive structures 310 may be formed on top surfaces of some of the exposed first connection pads 120. The conductive structures 310 may be formed by the same method as that used for forming the under-bump patterns 110 of the first preliminary redistribution substrate 100p. For example, a resist pattern having an opening may be formed on the first preliminary redistribution substrate 100p. An electroplating process may be performed to fill the opening, and the resist pattern may be removed to form the conductive structure 310. The conductive structures 310 may be formed to have their shapes (e.g., cylindrical shapes) each of which has a relatively small width in a first direction D1 and a relatively large length in a second direction D2 as shown in FIG. 6.

Figure 7:
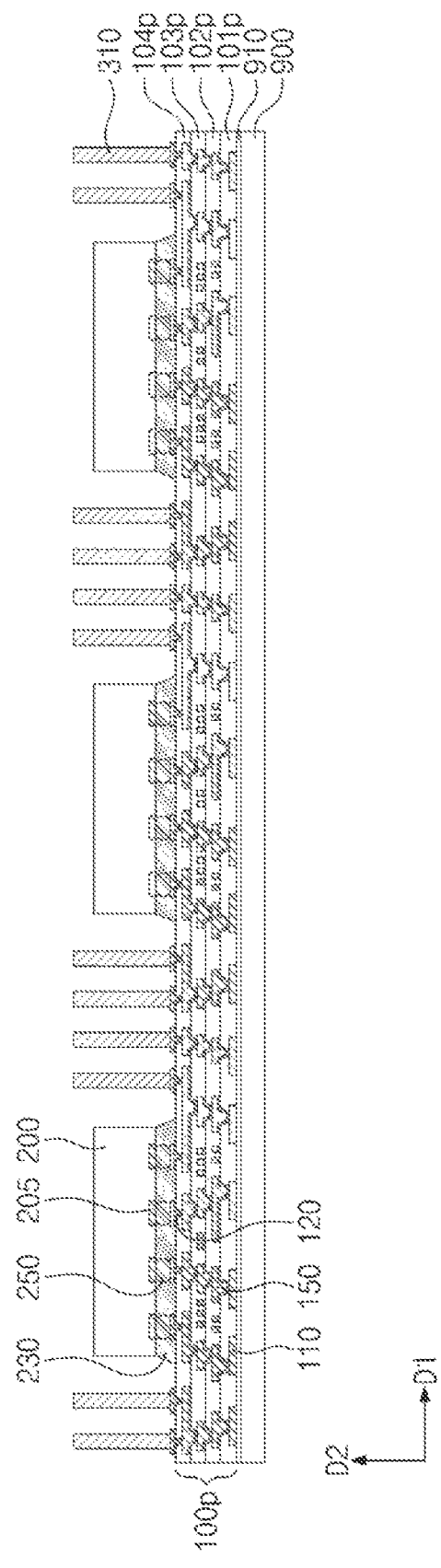

Referring to FIG. 7, first semiconductor chips 200 may be mounted on the first preliminary redistribution substrate 100p. For example, the first semiconductor chips 200 may be provided on the first preliminary redistribution substrate 100p. In this step, the first semiconductor chip 200 may include first chip pads 205, and the first chip pads 205 may face the first preliminary redistribution substrate 100p. The first chip pads 205 may be correspondingly aligned with the first connection pads 120. Lower connection terminals 250 may be formed on corresponding first connection pads 120. The lower connection terminals 250 may contact corresponding first chip pads 205. The first semiconductor chip 200 may be electrically connected through the lower connection terminals 250 to the first redistribution patterns 150. A first under-fill layer 230 may be formed to fill a gap between the first semiconductor chip 200 and the first preliminary redistribution substrate 100p. The first under-fill layer 230 may surround and seal the lower connection terminal 250.

Figure 8:
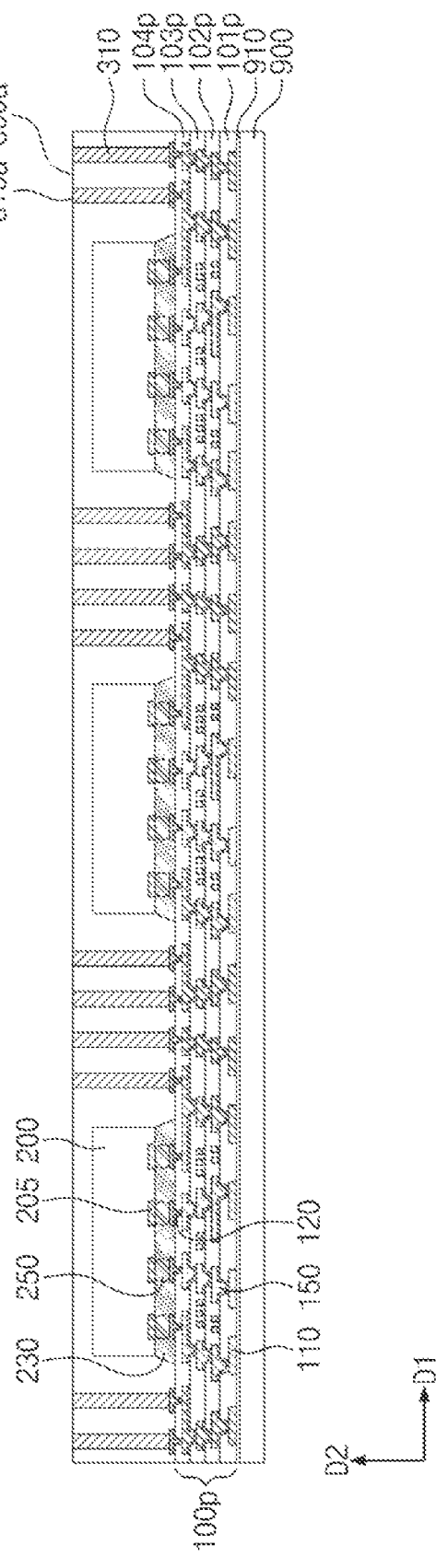

Referring to FIG. 8, a first preliminary molding layer 300p may be formed on the first preliminary redistribution substrate 100p, thereby covering the first semiconductor chips 200. The first preliminary molding layer 300p may fill a gap between the conductive structures 310 and a gap between the first semiconductor chip 200 and the conductive structures 310. A planarization process, such as chemical mechanical polishing (CMP), may be performed on a top surface 300a of the first preliminary molding layer 300p. The planarization process may continue until top surfaces 310a of the conductive structures 310 are exposed. Therefore, the top surface 300a of the first preliminary molding layer 300p may be coplanar with the top surfaces 310a of the conductive structures 310.

Figure 9:
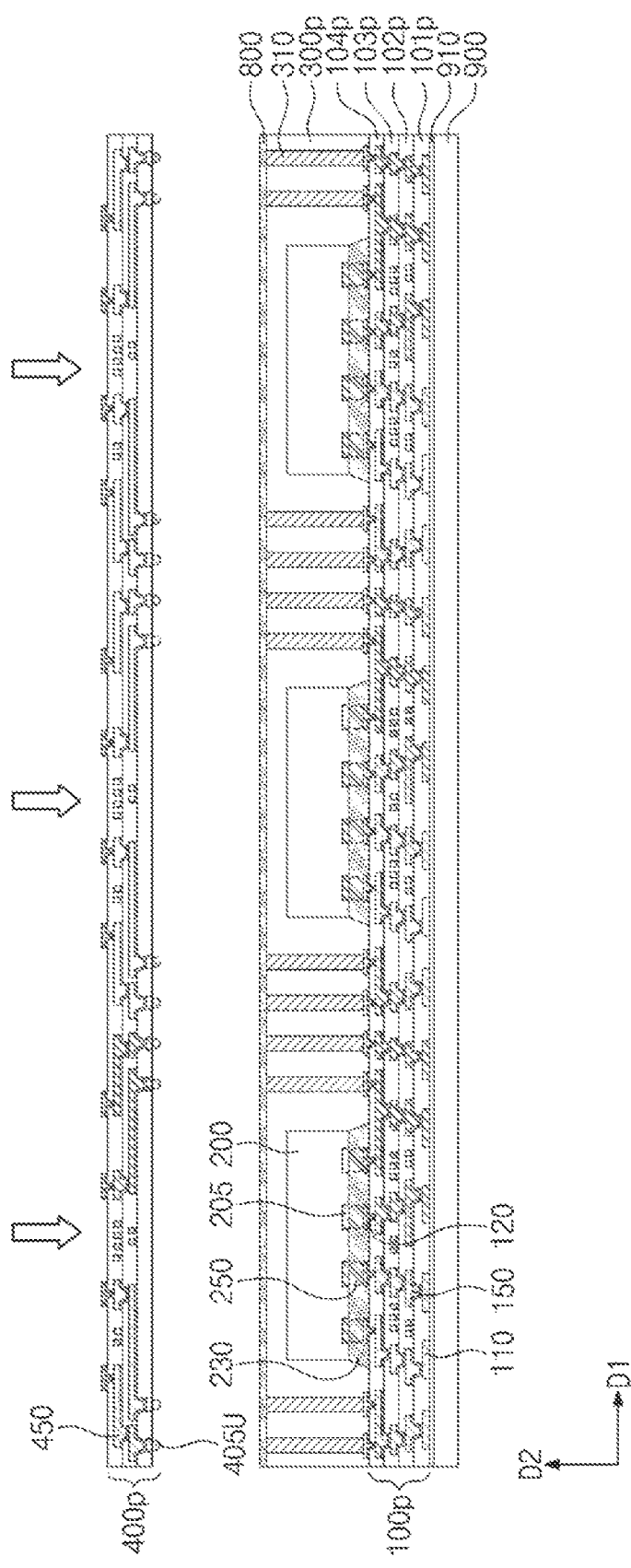
Figure 10:
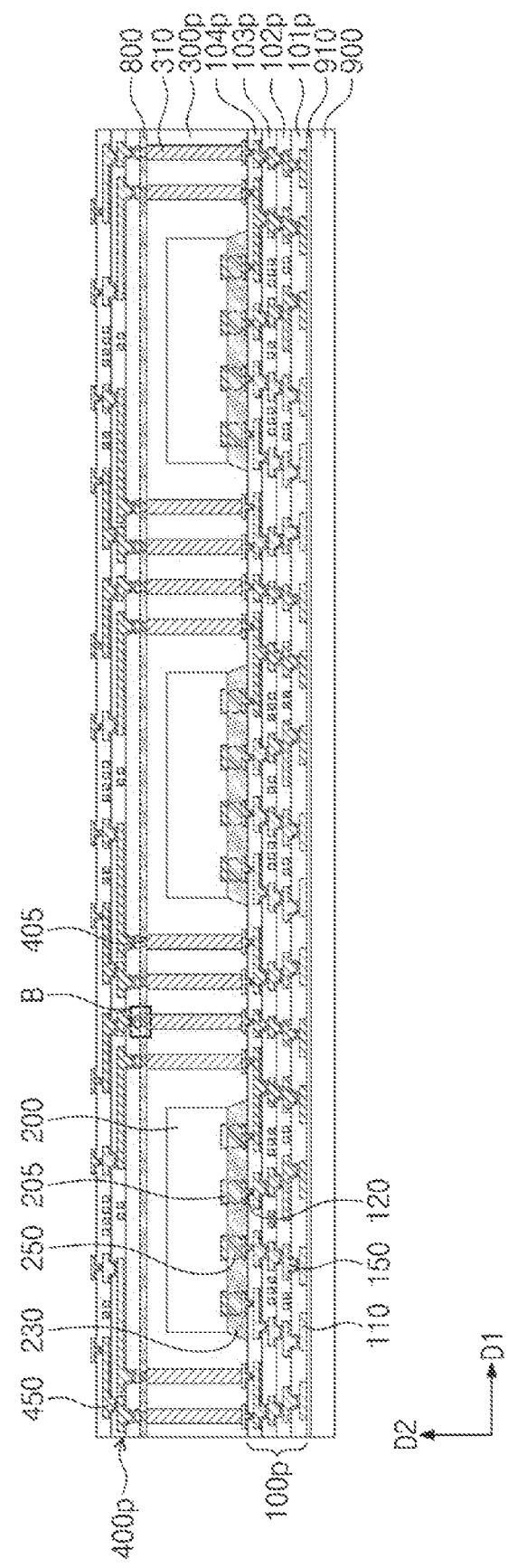
Figure 11:
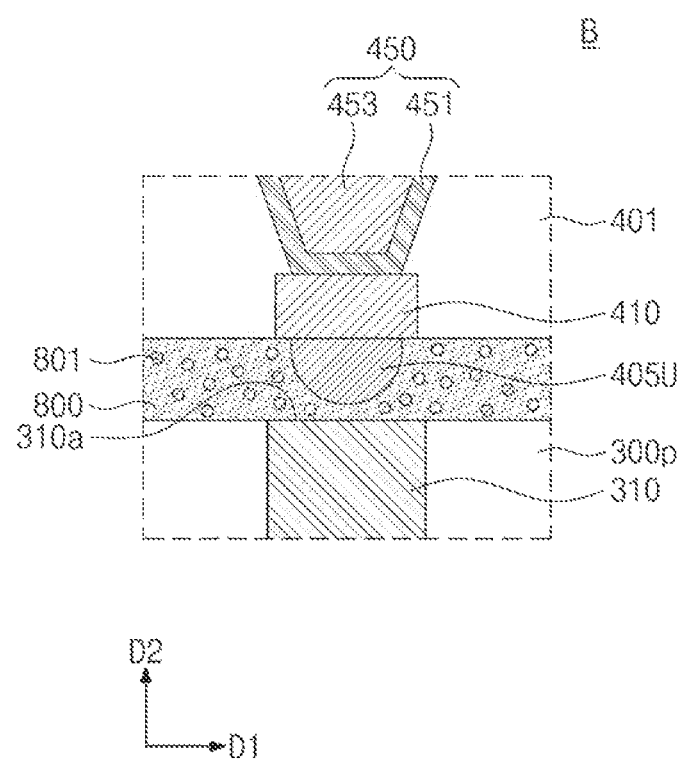
FIG. 11 illustrates an enlarged view showing section B of FIG. 10.

Referring to FIGS. 9 and 10, an adhesive film 800 may be provided on the top surface 300a of the first preliminary molding layer 300p and the top surfaces 310a of the conductive structures 310. The adhesive film 800 may be in contact with and attached to the top surface 300a of the first preliminary molding layer 300p and the top surfaces 310a of the conductive structures 310. For example, the adhesive film 800 may include a photo-curable resin or a thermo-curable resin, and may be attached in a non-cured state. A second preliminary redistribution substrate 400p may be provided on the adhesive film 800. In this step, the second preliminary redistribution substrate 400p may include second redistribution patterns 450 and first parts 405U of connection terminals which will be discussed below. The second preliminary redistribution substrate 400p may be formed by a method substantially the same as that used for forming the first preliminary redistribution substrate 100p. The second preliminary redistribution substrate 400p may be manufactured in a space separated from that in which the first preliminary redistribution substrate 100p is manufactured. The first and second preliminary redistribution substrates 100p and 400p may be simultaneously formed in different spaces from each other. The second preliminary redistribution substrate 400p may be placed to allow the first parts 405U to face a top surface of the adhesive film 800. The first parts 405U may be vertically aligned with corresponding conductive structures 310.

In general, an increase in process time may raise manufacturing cost, and warpage defects or the like may highly probably occur when complicated subsequent processes are continuously performed on the first preliminary redistribution substrate 100p that is formed at an earlier stage of fabrication. According to some example embodiments of the disclosure, the first and second preliminary redistribution substrates 100p and 400p may be formed in different spaces from each other and may be fixed to each other through the adhesive film 800. Therefore, compared to a case where the first preliminary redistribution substrate 100p is formed and thereafter the second preliminary redistribution substrate 400p is formed, example embodiments may decrease process steps, reduce manufacturing cost, and increase product reliability. Moreover, in the case where the first preliminary redistribution substrate 100p is formed and thereafter the second preliminary redistribution substrate 400p is formed, when defects occur in a partial region of the second preliminary redistribution substrate 400p during its fabrication, it may become necessary to discard the first semiconductor chip 200 mounted on its position that corresponds to the partial region. According to some example embodiments of the disclosure, the second preliminary redistribution substrate 400p may be separately manufactured, and a defect inspection may be executed before the second preliminary redistribution substrate 400p is fixed to the first preliminary redistribution substrate 100p. In this case, the first preliminary redistribution substrate 100p may be provided with a dummy chip on its area that corresponds to a defect position of the second preliminary redistribution substrate 400p, and therefore good chips may be prevented from being consumed. Accordingly, it may be possible to effectively reduce manufacturing cost.

Referring to FIGS. 10 and 11, a pressure may be applied to a top surface of the second preliminary redistribution substrate 400p, and thus the adhesive film 800 may be attached to the second preliminary redistribution substrate 400p. As the adhesive film 800 is in a flexible state, the pressure may allow the adhesive film 800 to receive the first parts 405U.

Under a specific pressure condition, heat may be applied to the adhesive film 800. The adhesive film 800 may have conductive particles 801 therein. Heat and pressure may compel the conductive particles 801 to flow and aggregate in the adhesive film 800. For example, the conductive particles 801 may be aggregated between the conductive structure 310 and the first part 405U. The conductive particles 801 may be attached to a surface of the first part 405U and the top surface 310a of the conductive structure 310, thereby forming a second part 405B as shown in FIG. 3B. Therefore, a connection terminal 405 may be formed which includes the first part 405U and the second part 405B. Some of the conductive particles 801 may not aggregate but may instead remain in the adhesive film 800. The adhesive film 800 may have some of the conductive particles 801 on its portion that vertically overlaps a section, or the first semiconductor chip 200, that is not adjacent to the first part 405U of the connection terminal 405. The remaining conductive particles 801 may not be electrically connected to the first part 405U of the connection terminal 405.

Figure 12:
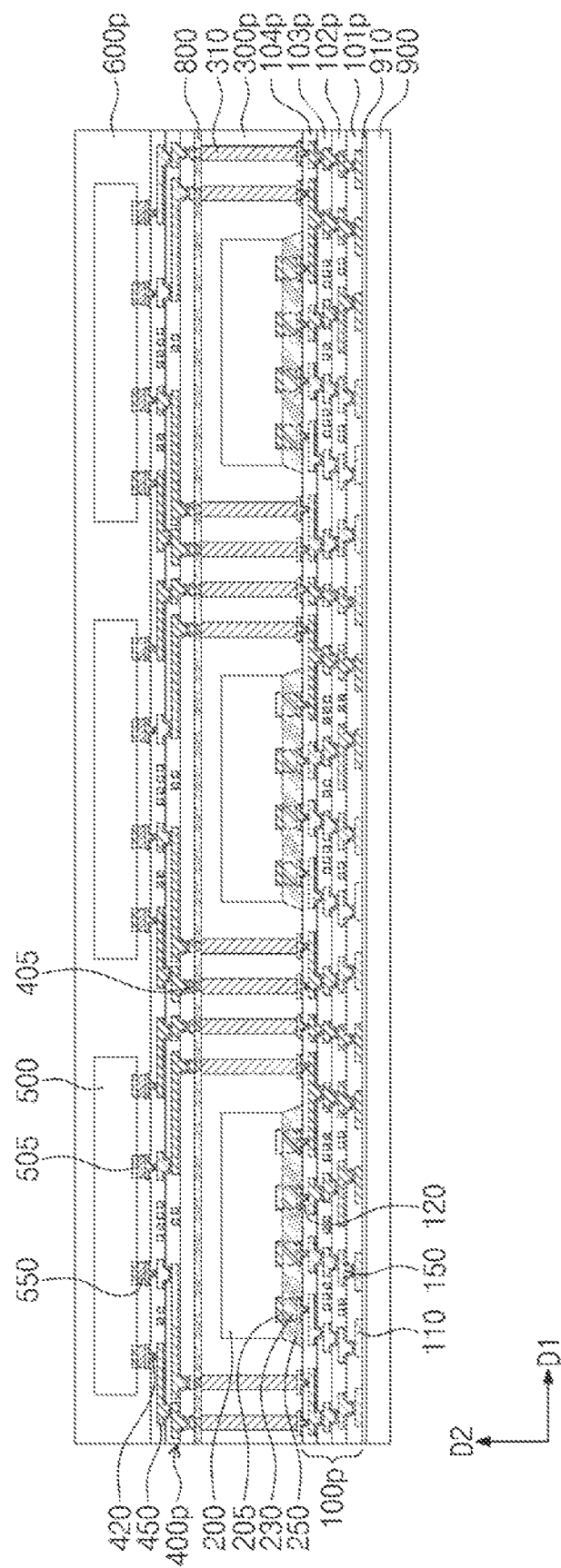

Referring to FIG. 12, second semiconductor chips 500 may be mounted on the second preliminary redistribution substrate 400p. For example, the second semiconductor chips 500 may be provided on the second preliminary redistribution substrate 400p. In this step, the second semiconductor chip 500 may include second chip pads 505, and the second chip pads 505 may face the second preliminary redistribution substrate 400p. The second chip pads 505 may be aligned with corresponding second upper connection pads 420. Upper connection terminals 550 may be formed on corresponding second upper connection pads 420. The upper connection terminals 550 may contact corresponding second chip pads 505. The second semiconductor chip 500 may be electrically connected through the upper connection terminals 550 to the second redistribution patterns 450. A second preliminary molding layer 600p may be formed on the second preliminary redistribution substrate 400p, thereby covering the second semiconductor chips 500. The second preliminary molding layer 600p may cover top and lateral surfaces of the second semiconductor chips 500 and a top surface of the second preliminary redistribution substrate 400p.

Figure 13:
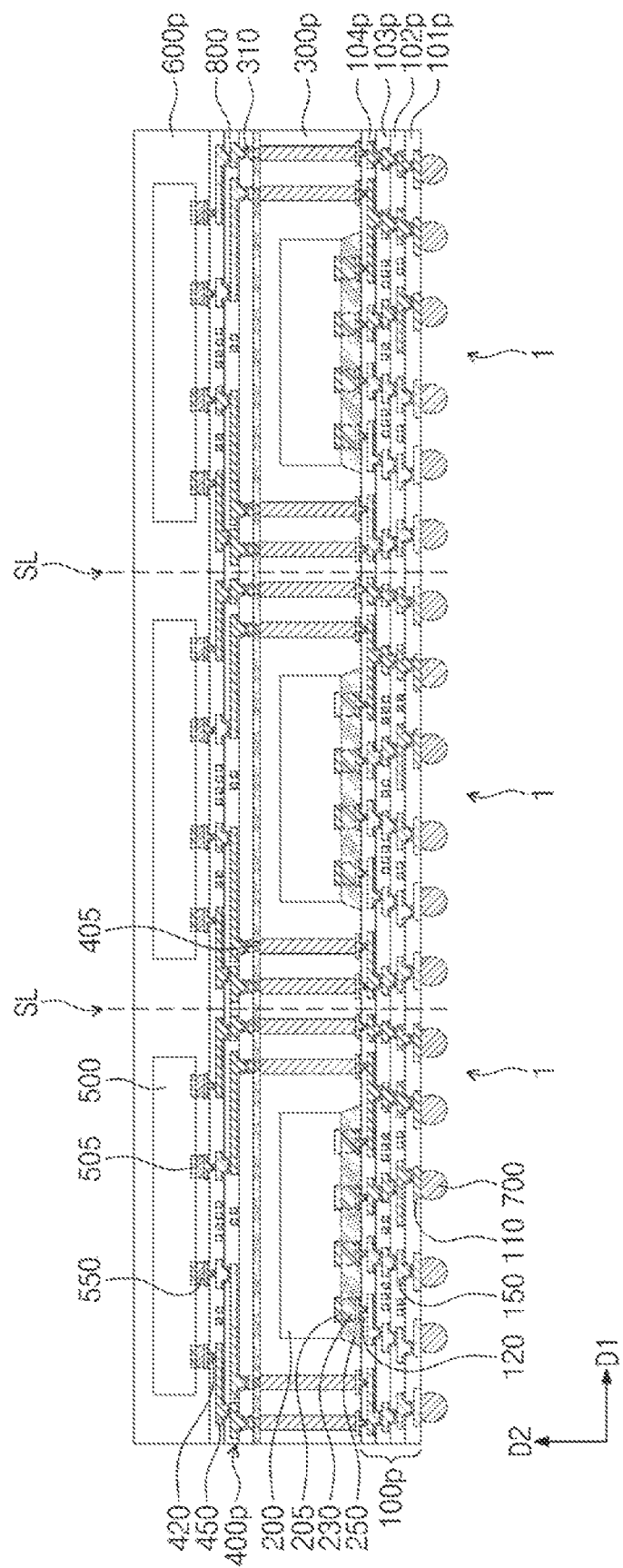

Referring to FIG. 13, the release layer 910 and the carrier substrate 900 may be removed from the first preliminary lower dielectric layer 101p, which removal may expose a bottom surface of the first preliminary lower dielectric layer 101p and bottom surfaces of the under-bump patterns 110.

External terminals 700 may be correspondingly formed on the exposed bottom surfaces of the under-bump patterns 110. The formation of the external terminals 700 may include performing a solder-ball attaching process.

Referring to FIGS. 1 and 13, the first preliminary redistribution substrate 100p, the first preliminary molding layer 300p, the second preliminary redistribution substrate 400p, and the second preliminary molding layer 600p may be diced along a cutting line SL, and therefore a plurality of semiconductor packages 1 may be separated from each other. Accordingly, there may be fabricated a semiconductor package according to some example embodiments of the disclosure.

According to the disclosure, an adhesive film may be provided between a first redistribution substrate and a second redistribution substrate. The first and second redistribution substrates may be fixed to each other through the adhesive film. Accordingly, it may be possible to reduce process time and to increase reliability of semiconductor packages.

This detailed description of the disclosure should not be construed as limited to the embodiments set forth herein, and it is intended that the disclosure cover the various combinations, modifications and variations of embodiments without departing from the spirit and scope of the disclosure. The appended claims should be construed to include other embodiments.

What is claimed is:

1. A method of manufacturing semiconductor package, comprising:
    forming a first redistribution substrate;
    forming a second redistribution substrate in another space different from a space in which the first redistribution substrate is formed, the second redistribution substrate comprising a connection terminal formed on a bottom surface thereof;
    forming a conductive structure on the first redistribution substrate;
    mounting a first semiconductor chip on the first redistribution substrate, the first semiconductor chip being spaced apart from the conductive structure in a first direction;
    forming a first molding layer covering the first semiconductor chip and the conductive structure;
    disposing an adhesive film on the first molding layer; and
    attaching the second redistribution substrate on the adhesive film,
    wherein the adhesive film comprises conductive particles and the connection terminal therein,
    wherein attaching the second redistribution substrate on the adhesive film comprises:
        aligning the connection terminal to vertically overlap the conductive structure;
        applying pressure on a top surface of the second redistribution substrate; and
        applying heat to the adhesive film,
    wherein the connection terminal comprises a first part and a second part that surrounds a lower portion of the first part after applying heat to the adhesive film,
    wherein a maximum width of the first part of the connection terminal is less than a width of the conductive structure, and
    wherein a maximum width of the second part of the connection terminal is equal to the width of the conductive structure.

2. The method of claim 1, wherein the second part of the connection terminal comprises a material that is different from that of the first part of the connection terminal.

3. The method of claim 1, wherein applying pressure on the top surface of the second redistribution substrate is performed until the first part is completely sealed by the adhesive film.

4. A method of manufacturing semiconductor package, comprising:
    forming a first preliminary redistribution substrate on a carrier substrate;
    forming a second preliminary redistribution substrate on another substrate that is different from the carrier substrate;
    forming a conductive structure on the first preliminary redistribution substrate;
    mounting a first semiconductor chip on the first preliminary redistribution substrate, the first semiconductor chip being spaced apart from the conductive structure in a first direction;
    forming a first preliminary molding layer covering the first semiconductor chip and the conductive structure;
    disposing an adhesive film on the first preliminary molding layer;
    attaching the second preliminary redistribution substrate on the adhesive film;
    mounting a second semiconductor chip on the second preliminary redistribution substrate;
    forming a second preliminary molding layer covering the second semiconductor chip; and
    forming a first redistribution substrate, a first molding layer, an adhesive pattern, a second redistribution substrate and a second molding layer by dicing the first preliminary redistribution substrate, the first preliminary molding layer, the adhesive film, the second preliminary redistribution substrate and the second preliminary molding layer.

5. The method of claim 4,
    wherein the second redistribution substrate comprises a connection terminal on a bottom surface of the second redistribution substrate,
    wherein the connection terminal comprises a first part and a second part that surrounds a lower portion of the first part, and
    wherein a top surface of the conductive structure is in contact with the second part.

6. The method of claim 1,
    wherein a maximum width of the first part of the connection terminal is less than a width of the conductive structure, and
    wherein a maximum width of the second part of the connection terminal is equal to the width of the conductive structure.

7. The method of claim 4, wherein a lateral surface of the adhesive pattern is coplanar with a lateral surface of the first redistribution substrate and a lateral surface of the second redistribution substrate.

8. The method of claim 4,
    wherein the first preliminary redistribution substrate comprises an under-bump pattern disposed adjacent to the carrier substrate, and
    wherein the method further comprises:
        exposing a bottom surface of the under-bump pattern by detaching the carrier substrate before dicing the first preliminary redistribution substrate, the first preliminary molding layer, the adhesive film, the second preliminary redistribution substrate and the second preliminary molding layer; and forming an external terminal on the bottom surface of the under-bump pattern.

9. The method of claim 4, wherein the adhesive film comprises conductive particles therein, and wherein the method further comprises applying heat to the adhesive film after attaching the second preliminary redistribution substrate on the adhesive film.

* * * * *